PUSH-PULL TRANSISTOR AMPLIFIERS WITH TRANSFORMER COUPLED DRIVER

Filed March 8, 1965 2 Sheets-Sheet 1

INVENTOR.
JACK C. SONDERMEYER
BY Eugene M. Whitacre
Attorney

INVENTOR.
JACK C. SONDERMEYER
BY
Eugene M. Whitacre
Attorney

United States Patent Office 3,417,339
Patented Dec. 17, 1968

3,417,339

PUSH-PULL TRANSISTOR AMPLIFIERS WITH TRANSFORMER COUPLED DRIVER

Jack C. Sondermeyer, Morris County, N.J., assignor to Radio Corporation of America, a corporation of Delaware Filed Mar. 8, 1965, Ser. No. 437,863
11 Claims. (Cl. 330—15)

ABSTRACT OF THE DISCLOSURE

A power amplifier having a pair of output transistors serially connected across a source of operating potential, with signals being applied to the bases thereof in push-pull fashion by means of the secondary windings of a transformer having primary winding coupling the collector of a driver transistor to an output terminal at the junction of the pair of transistors, and with the energization potential for the driver transistor being so provided and the polarities of the transformer windings so polarized that the voltage swing at the aforementioned collector is substantially less than the voltage swing across the primary winding.

This invention relates to electrical signal amplifier circuits, and more particularly to driver stages for power amplifier circuits embodying semiconductor devices.

Amplifier output stages such as push-pull amplifiers often employ transformer coupling between the driver stage and the output stage to provide the required push-pull signals for driving each half of the push-pull output stage. The driver stage is generally a single-ended Class A amplifier including an amplifying device such as a transistor connected in series with the transformer primary winding and the power supply.

The disadvantage of using a Class A transformer driver stage is that twice the power supply voltage is developed at the output electrode of the amplifying device under normal high signal operating conditions. As a result, the economies of transistor amplifier circuits are effected by requiring a more expensive driver transistor, i.e. a transistor having a reverse collector breakdown voltage of at least twice the value of the applied power supply voltage.

With commercially available high voltage breakdown transistors, it is presently advantageous to build amplifier circuits powered by high voltage power supplies, to produce the required amount of output power at higher voltages and lower currents. The allows for the use of power supplies that directly rectify the line voltage, thereby eliminating the cost of the step-down power transformers.

In single ended push-pull circuits a pair of output transistors are connected in series and are directly or capacitively coupled to drive a load in push-pull relation without using an output transformer. As a result, the maximum voltage developed across either of the output transistors is approximately equal to the power supply voltage. In the case of the driver stage, including a driver transformer to provide the push-pull drive for the output stage, the primary winding of the driver transformer is usually coupled between the collector electrode of the driver transistor and a terminal of the operating voltage supply. As a result, the reverse voltage breakdown of the driver transistor must be greater than twice the power supply voltage. Thus, in circuits of this type the driver stage transistors must have greater reverse voltage breakdown characteristics than the transistors in the output stage.

It is therefore an object of this invention to provide an improved push-pull amplifier system.

It is also an object of this invention to provide an improved driver stage for a single-ended push-pull amplifier which reduces the reverse collector breakdown voltage requirements for the driver transistor.

It is still a further object of this invention to provide an improved driver stage for single-ended push-pull amplifiers that operate at a lower power dissipation to obtain a given power output from the push-pull amplifier.

As noted above, a single-ended push-pull amplifier includes at least a pair of power output transistors connected to drive a load, such as a loudspeaker, in push-pull relation. The output transistors are connected in series across a source of operating potential, and the load is directly or capacitively coupled to the junction between the series connected output transistors.

A driver stage including a transistor and a driver transformer is coupled to apply signals in push-pull relation to the output transistors. The driver transformer includes a primary winding and secondary winding means coupled to the respective output transistors. One end of the primary winding is connected to the collector electrode of the driver transistor, and the other end thereof is coupled to the junction between the two series connected output transistors. The phasing and connections of the driver transformer secondary winding means are such that signals applied to the driver transistor which tend to increase the current through the driver transistor are coupled to the output transistors in a manner such that the voltage across the load changes in a direction to increase the voltage applied to the collector electrode of the driver transistor.

The novel features which are considered to be characteristic of this invention are set forth with particularity in the appended claims. The invention itself, however, both as to its organization and method of operation, as well as additional objects and advantages thereof, will best be understood from the following description when read in connection with the accompanying drawings in which:

Figure 1:
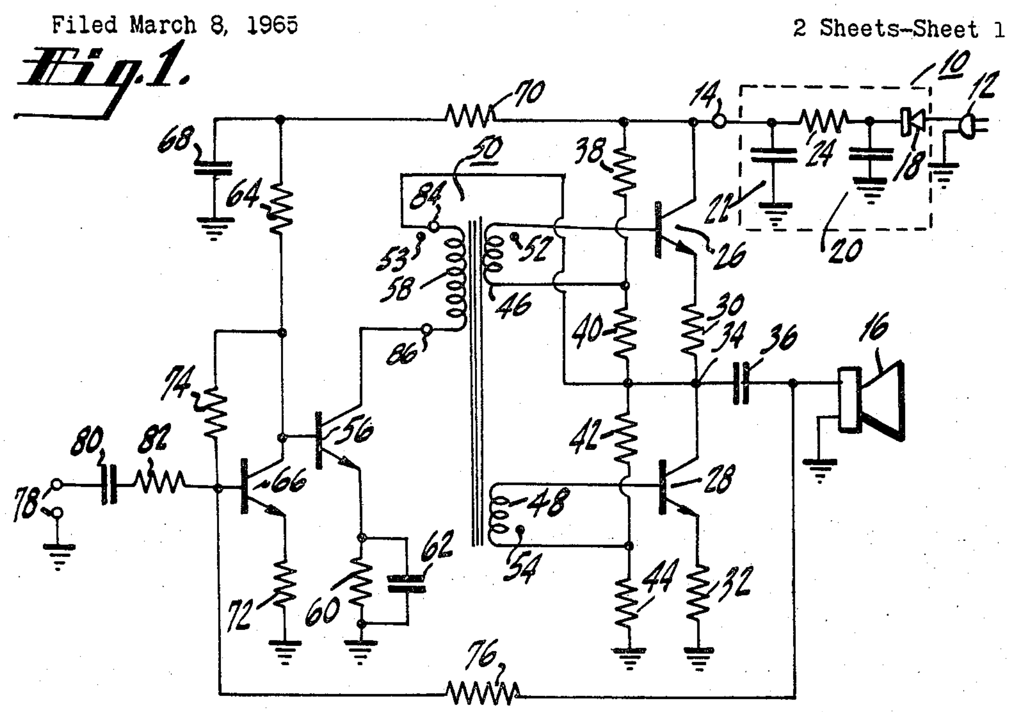
FIGURE 1 is a schematic circuit diagram of a push-pull amplifier circuit embodying the invention.

The circuit of FIGURE 1 is a line operated audio amplifier including a power supply shown within a dashed block 10. The power supply 10 is adapted to be connected to the standard 60 cycle main voltage through a plug 12, and includes a rectifier 18 for rectifying the A-C line voltage. The rectified voltage is filtered by the shunt capacitors 20 and 22 and a series resistor 24 to produce an output voltage at the power supply output terminal 14.

The power output stage illustrated in FIGURE 1 is a single-ended push-pull amplifier wherein two output transistors 26 and 28 and two stabilizing resistors 30 and 32 are connected in series between the power supply output terminal 14 and a point of reference potential illustrated as ground. The amplified output signal is developed at a signal output terminal 34 and is coupled through a capacitor 36 to drive the loudspeaker 16. The capacitor 36 is of low impedance to signal frequencies.

The resistors 38, 40, 42 and 44, connected in series between the power supply output terminal 14 and ground, and a direct connection between the junction of resistors 40 and 42 and the signal output terminal 34, form a biasing network for the output transistors 26 and 28. The biasing voltages are applied to the bases of the respective transistors through the secondary windings 46 and 48 of a driver transformer 50. The secondary windings 46 and 48 are poled (as designated by the dots 52 and 54) to apply signals, 180° out-of-phase, to the output transistors 26 and 28 to drive them in a push-pull manner.

The driver stage includes a driver transistor 56 connected in a common-emitter configuration. The emitter electrode of transistor 56 is connected to ground through a biasing network including a resistor 60 and a parallel bypass capacitor 62. The collector electrode of the transistor 56 is connected through the primary winding 58 of the driver transformer 50 to the signal output terminal 34. Thus the output voltage developed at the signal output terminal 34 includes a direct current component of a value about half that at the power supply terminal 14 and a signal component equal to that applied to the load. This voltage at terminal 34 is the energizing or collector voltage for the transistor 56.

The driver transistor 56 is biased for Class A operation by a direct coupled input amplifier stage including an input transistor 66. The collector electrode of the input transistor 66 is directly connected to the base electrode of the driver transistor 56 and is also connected to the power supply output terminal 14 through a load resistor 64 and a series dropping resistor 70. A filter capacitor 68 is connected between the junction of the load resistor 64 and the series dropping resistor 70 and ground. The network including the resistors 64 and 70 and the capacitor 68 essentially provides a filtered low voltage for energizing the input transistor 66 and for biasing the driver transistor 56. Since the input transistor 66 is directly coupled to the driver transistor 56, the quiescent operating current of both transistors are essentially set by a biasing resistor 74 connected between the collector and base electrodes of the input transistor 66. A resistor 76 provides a degenerative feedback path from the loudspeaker 16 to the base of the input transistor 66 to stabilize the operation of the overall amplifier system.

Input signals are applied across the input terminals 78 and are coupled through a capacitor 80 and a series resistor 82 to the base of the input transistor 66. The input signals are amplified by the input transistor 66 and are coupled to the base of the driver transistor 56, which in turn drives the output stage in a push-pull manner.

The output stage, in the present embodiment, is biased for Class AB operation (both transistors 26 and 28 being slightly conductive during quiescent operation) to minimize the power dissipation of the stage. Since the output transistors 26 and 28 are connected in series, essentially all of the collector-to-emitter direct current flowing through the top output transistor 26 flows through the bottom output transistor except for the current flowing through the driver stage (the current through the primary winding 58 and the driver transistor 56). Under signal conditions, the driver current flow through the transistor 56 is small compared to the output signal currents and can be neglected. One the other hand during quiescent operation the current flowing through the output transistors 26 and 28 is low, therefore the quiescent current of the driver stage is more significant, and is compensated by proper selection of the values of resistors 38, 40, 42 and 44 so that the voltage developed at the signal output terminal 34 (under quiescent operating conditions) is approximately equal to one-half the power supply voltage.

The phasing between the primary winding 58 and the secondary windings 46 and 48 is conventionally designated by the dots 52, 53 and 54. In operation, as the driver transistor 56 current increases (with an increasing positive voltage at the base of transistor 56) the signal developed across the secondary winding 46 is of a polarity to drive the top output transistor 26 toward saturation, while the signal developed across the other secondary winding 48 is of a polarity to drive the bottom output transistor 28 toward cut-off. The highest voltage that is developed at the signal output terminal 34 approaches the value of the power supply voltage. When the current through the driver transistor 56 decreases (with a decreasing positive voltage at the base of the transistor 56) the signal developed across the secondary winding 46 is of a polarity to drive the top output transistor 26 toward cut-off, while the signal developed across the other secondary winding 48 is of a polarity to drive the bottom output transistor 28 toward saturation. As a result, the lowest voltage that is developed at the output terminal 34 approaches zero volts. Effectively, the maximum signal output of the circuit approaches a peak-to-peak voltage swing that is substantially equal to the magnitude of the applied power supply voltage at the power supply terminal 14.

It should be noted that as the current through the driver transistor 56 increases toward saturation the output voltage at the terminal 34 simultaneously increases towards the value of the power supply voltage so that the voltage developed at the end 84 of the primary winding 58 approaches the power supply voltage while the voltage at the end 86 approaches ground. Thus the total power supply voltage, under peak signal conditions, is developed across the primary winding 58. As the current through the driver transistor decreases towards cutoff, the output voltage at the terminal 34 approaches ground (zero). Under peak signal conditions, as the transistor 56 goes toward cutoff, the primary winding voltage reverses and applies a reverse (positive) voltage to the collector electrode of the transistor 56 which is about equal to the output voltage at the terminal 14. As a result, essentially twice the power supply voltage, peak-to-peak, is developed across the primary winding 58 but the positive voltage which subjects the driver transistor to collector over-voltage breakdown is, under normal conditions, restricted to the value of the power supply voltage. With twice the power supply voltage (peak-to-peak) appearing across the primary winding 58, the same amount of output power is developed by the driver circuit of the invention as by a known driver circuit having the primary winding directly connected to the power supply. However such known driver circuits subject the driver transistor to twice as great a collector voltage as the present circuit of the invention during the time when the driver transistor is driven toward cutoff. Thus the circuit of the invention may use a transistor having a lower reverse voltage breakdown characteristic than that of the driver circuits of the prior art.

By connecting the end 84 of the primary winding 58 to the signal output terminal 34, the voltage developed at terminal 34 effectively acts as a source of energizing potential for the driver stage and also provides a form of regenerative feedback whereby less power is required to drive the output stage to full power output. The negative feedback circuit from the loudspeaker 16 to the base of the input transistor 66 through the resistor 76, counteracts instabilities that can be introduced into the circuit by the positive feedback, and thereby stabilizes the operation of the amplifier system.

Figure 2:
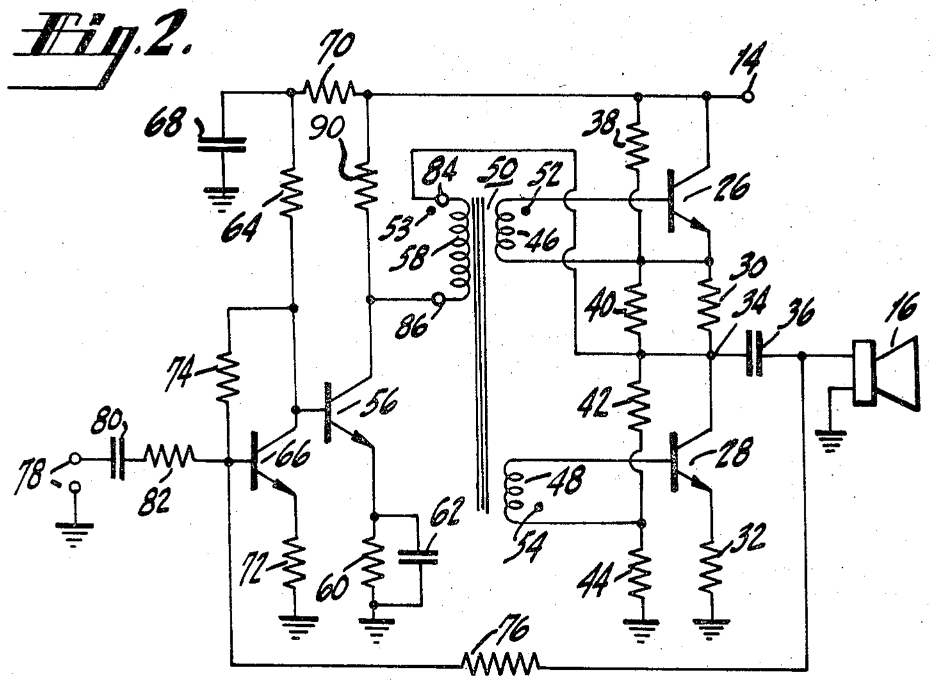
FIGURE 2 is a schematic circuit diagram of a modification of the amplifier circuit of FIGURE 1.

The circuit of FIGURE 1 can be modified to reduce the amount of quiescent operating current flowing in the driver transformer 50 by the circuit illustrated in FIGURE 2. The same reference numerals as applied in FIGURE 1 will apply to the same components in FIGURE 2.

In FIGURE 2 an added resistor 90 is connected between the collector of the driver transistor 56 and the power supply terminal 14. Under quiescent operating conditions, a portion of the current flowing through the driver transistor 56 will flow through the resistor 90 thereby reducing the amount of the quiescent current flowing through the driver transformer 50 thus improving the low frequency response of the transformer. In addition, some of the current which, in the circuit of FIGURE 1 flows through the output transistor 26, is diverted through the resistor 90 thereby improving the balance between the transistors 26 and 28. The amount of current that can be bypassed to the power supply through resistor 90 is limited by the stability of the circuit. If a substantial portion of the quiescent operating current flows through the resistor 90, the circuit has a tendency to oscillate. Otherwise, the circuit of FIGURE 2 will operate in the same manner as disscussed in regards to FIGURE 1.

The circuit of FIGURE 1 can be further modified so as to remove the quiescent operating current of the driver transistor 56 from flowing through output transistor 26. The same reference numerals as applied in FIGURE 1 will apply to the same components in FIGURE 3.

Figure 3:
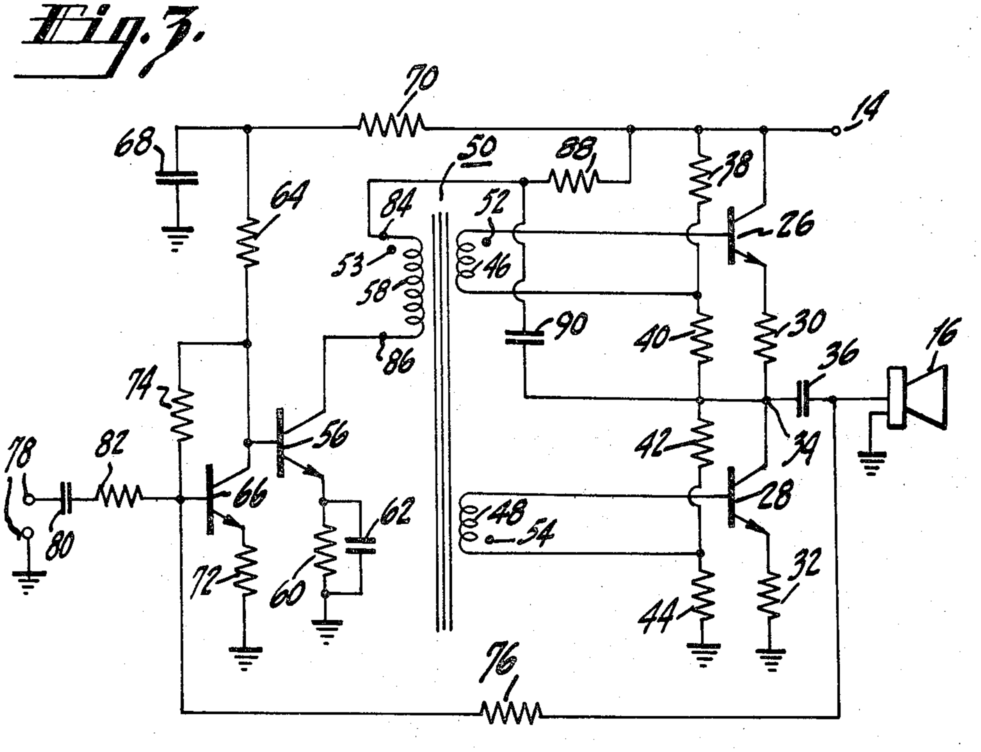
FIGURE 3 is a schematic circuit diagram of another embodiment of a push-pull circuit embodying the invention.

In the modification illustrated in FIGURE 3, the end 84 of the primary winding 58 is connected to the power supply terminal 14 through a resistor 88 rather than to the output point 34 as shown in FIGURE 1. A capacitor 90, which exhibits low impedance at signal frequencies, is connected between the end 84 of the primary winding 58 and the output terminal 34. With the circuit of FIGURE 3, all the quiescent operating current of the driver stage flows through the resistor 88 rather than through the output transistor 26 so that the quiescent operating currents through the output transistors 26 and 28 are substantially equal. The value of the resistor 88 is set to limit the quiescent operating voltage applied to the collector of the driver transistor 56 to approximately one half the power supply voltage. The value of the capacitance of capacitor 90 is sufficiently large so that essentially all the signal developed at point 34 is coupled through the capacitor 90 at all frequencies of interest so that the driver circuit essentially operates in the same manner as described in regards to FIGURE 1.

What is claimed is:

1. A transistor amplifier circuit comprising:
a pair of transistors, each having emitter, base and collector electrodes with an internal collector-emitter current path;
a source of energizing potential having a pair of terminals;
means for coupling the collector-emitter current paths of said pair of transistors in a series circuit between said pair of terminals;
output circuit means coupled to the junction of said series connected transistors;
a transformer having a primary winding and secondary winding means, with said secondary winding means being coupled to drive said pair of transistors in push-pull relation;
a driver transistor having emitter, base and collector electrodes with an internal collector-emitter current path, and exhibiting a reverse collector breakdown voltage substantially less than twice the voltage value of said source of energizing potential;
input circuit means coupled to the base electrode of said driver transistor for supplying signals to be amplified; and
means coupling said primary winding between the collector-emitter current path of said driver transistor and said series connected transistor junction for providing peak-to-peak amplified signal swings across said winding of a value substantially equal to twice the voltage value of said energizing potential source.

2. A transistor amplifier circuit comprising:
a pair of transistors, each having emitter, base and collector electrodes with an internal collector-emitter current path;
a soure of energizing potential having a pair of terminals;
means coupling the collector-emitter current paths of said pair of transistors in a series circuit between said pair of terminals;
output circuit means coupled to the junction of said series connected transistors;
a transformer having a primary winding and secondary winding means;
a driver transistor having emitter, base and collector electrodes with an internal collector-emitter current path;
means coupling said primary winding between the collector-emitter current path of said driver transistor and said series connected junction;
input circuit means coupled to the base electrode of said driver transistor for supplying signals to be amplified; and
means coupling said secondary winding means to drive said pair of series connected transistors in push-pull relation in response to supplied input signals, the phasing of said secondary winding means relative to said primary winding being such as to provide peak-to-peak amplified signal swings across said primary winding of a value substantially equal to twice the voltage value of said source of energizing potential and peak-to-peak amplified signal swings across the collector and emitter electrodes of said driver transistor of a value substantially equal to the voltage value of said energizing potential source.

3. A power amplifier circuit comprising:
a single-ended push-pull amplifier stage including a pair of transistors connected in series and having an output terminal connected to the junction therebetween;
a source of energizing potential connected between a supply point and a reference point;
means coupling said series connected transistors between said supply point and said reference point for applying an energizing potential to said single-ended push-pull power amplifier stage such that a portion of the energizing potential is developed at said output terminal;
a transformer having a primary winding and a pair of secondary windings;
means coupling said pair of secondary windings to said pair of series connected transistors for applying signals thereto in push-pull relation;
a driver transistor having first, second and control electrodes with an internal current path between said first and second electrodes;
means coupling said primary winding and said internal current path in series between said reference point and said output terminal whereby an operating voltage for said driver transistor is supplied by the portion of the energizing potential developed at said output terminal; and
input circuit means coupled to the control electrode of said driver transistor for applying signals to be amplified;
with said primary winding and said secondary windings being so polarized as to provide peak-to-peak amplified signal swings across said primary winding in response to applied input signals of a value substantially equal to twice the voltage value of said source of energizing potential and peak-to-peak amplified signal swings across the first and second electrodes of said driver transistor of a value substantially equal to the voltage value of said energizing potential source.

4. A transistor amplifier circuit as defined in claim 1 wherein said last mentioned means also provides the operating potential for said driver transistor through said primary winding.

5. A transistor amplifier circuit as defined in claim 1 wherein said last mentioned means direct current conductively couples said primary winding between said collector-emitter current path and said junction to also provide an operating potential for said driver transistor, and wherein there is further included resistive means serially coupled between the collector-emitter current path of said driver transistor and the terminals of said source of energizing potential for improving the low frequency response of said transformer by reducing the resulting quiescent current flow through said primary winding.

6. A transistor amplifier circuit as defined in claim 1 wherein said last mentioned means capacitively couples said primary winding between said collector-emitter current path and said junction, and wherein there is further included resistive means serially coupled between the collector-emitter current path of said driver transistor and the terminals of said source of energizing potential for providing an operating potential for said driver transistor of a value substantially equal to one-half the voltage value of said energizing potential source.

7. A transistor amplifier circuit as defined in claim 2 wherein said output circuit means includes a loudspeaker and wherein there is also included degenerative feedback means coupled between said loudspeaker and the base electrode of said driver transistor for stabilizing the operation of said amplifier circuit.

8. A transistor amplifier circuit comprising:

first, second, and third transistors, each having emitter, base, and collector electrodes;

a source of energizing potential having first and second terminals;

a transformer having a primary winding and first and second secondary windings;

means connecting the emitter electrode of said first transistor to the collector electrode of said second transistor and providing an output terminal for said circuit;

means respectively connecting the collector electrode of said first transistor to said first potential terminal and the emitter electrode of said second transistor to said second potential terminal;

means respectively connecting said first transformer secondary winding between the base and emitter electrodes of said first transistor and said second transformer secondary winding between the base and emitter electrodes of said second transistor;

means connected between the base and emitter electrodes of said third transistor for supplying input signals to be amplified; and means connecting said transformer primary winding between the collector electrode of said third transistor and said output terminal;

with said primary and secondary windings being polarized with respect to one another so that amplified signals from the collector electrode of said third transistor are coupled to said first and second transistors in push-pull relation and so that the resulting peak-to-peak signal swing developed across said primary winding is substantially in excess of that developed across the collector and emitter electrodes of said third transistor.

9. A transistor amplifier circuit as defined in claim 8 wherein said transformer primary winding connecting means comprises direct connections from the opposite ends of said winding to the collector electrode of said third transistor and to said output terminal, respectively.

10. A transistor amplifier circuit as defined in claim 9 wherein there is additionally included a separate direct current connection from the collector electrode of said third transistor to said first potential terminal.

11. A transistor amplifier circuit as defined in claim 8 wherein said transformer primary winding connecting means comprises a direct connection from the collector electrode of said third transistor to one end of said winding and a capacitive connection from the other end of said winding to said output terminal, and wherein there is additionally included a separate, direct current connection from the collector electrode of said third transistor to said first potential terminal to provide an operating voltage for said third transistor substantially less than the voltage value of said energizing potential source.

References Cited

FOREIGN PATENTS 811,766 4/1959 Great Britain.

ROY LAKE, *Primary Examiner.*

SIEGFRIED H. GRIMM, *Assistant Examiner.*

U.S. Cl. X.R.

330—18, 26, 28